(12) United States Patent
Hirao et al.

(10) Patent No.: US 7,988,784 B2
(45) Date of Patent: Aug. 2, 2011

(54) METHOD FOR MANUFACTURING III METAL NITRIDE SINGLE CRYSTAL

(75) Inventors: Takayuki Hirao, Nagoya (JP); Katsuhiro Imai, Nagoya (JP); Mikiya Ichimura, Ichinomiya (JP)

(73) Assignee: NGK Insulators, Ltd., Nagoya (JP)

(*) Notice: Subject to any disclaimer, the term of this patent is extended or adjusted under 35 U.S.C. 154(b) by 0 days.

(21) Appl. No.: 12/804,521

(22) Filed: Jul. 23, 2010

(65) Prior Publication Data

US 2010/0307404 A1    Dec. 9, 2010

Related U.S. Application Data

(63) Continuation of application No. PCT/JP2009/051394, filed on Jan. 22, 2009.

(30) Foreign Application Priority Data

Jan. 24, 2008  (JP) .................. 2008-013689

(51) Int. Cl.
*C30B 19/12* (2006.01)

(52) U.S. Cl. ............... 117/59; 117/54; 117/58; 117/63; 117/952

(58) Field of Classification Search .................. 117/54, 117/58, 59, 63, 952

See application file for complete search history.

(56) References Cited

U.S. PATENT DOCUMENTS

| | | | |
|---|---|---|---|
| 4,317,085 A * | 2/1982 | Burnham et al. | 372/50.1 |
| 5,608,234 A * | 3/1997 | Jiang | 257/94 |
| 5,629,232 A * | 5/1997 | Jiang | 438/40 |
| 2002/0038892 A1 | 4/2002 | Otani et al. | |
| 2004/0144300 A1 | 7/2004 | Kitaoka et al. | |
| 2004/0183090 A1 | 9/2004 | Kitaoka et al. | |
| 2007/0101931 A1 | 5/2007 | Yamazaki et al. | |
| 2007/0187700 A1 | 8/2007 | Kitaoka et al. | |

FOREIGN PATENT DOCUMENTS

| | | |
|---|---|---|
| JP | 2002-043223 | 2/2002 |
| JP | 2004-182551 | 7/2004 |
| JP | 2004-244307 | 9/2004 |
| JP | 2005-012171 | 1/2005 |
| JP | 2007-246368 | 9/2007 |
| JP | 2007-335484 | 12/2007 |
| JP | 2008-239365 | 10/2008 |

* cited by examiner

*Primary Examiner* — Robert M Kunemund

(74) *Attorney, Agent, or Firm* — Burr & Brown

(57) ABSTRACT

It is used a substrate main body 1 having a side face 1b and a pair of main faces 1a and an underlying film 2 of a single crystal of a nitride of a metal belonging to the group III formed at least on one main face of the substrate main body 1. A single crystal 3 of a nitride of a metal belonging to the group III is grown on the main face 1a of the substrate main body 1 by a liquid phase process. The underlying film 2 has a shape of a convex figure in a plan view. A surface 4 without the underlying film thereon surrounds the entire circumference of the underlying film 2. The single crystal 3 of a nitride of a metal belonging to the group III grown on the underlying film 2 is not brought into contact with a single crystal of a nitride of a metal belonging to group III formed on another underlying film.

2 Claims, 13 Drawing Sheets

Fig. 1
(a)
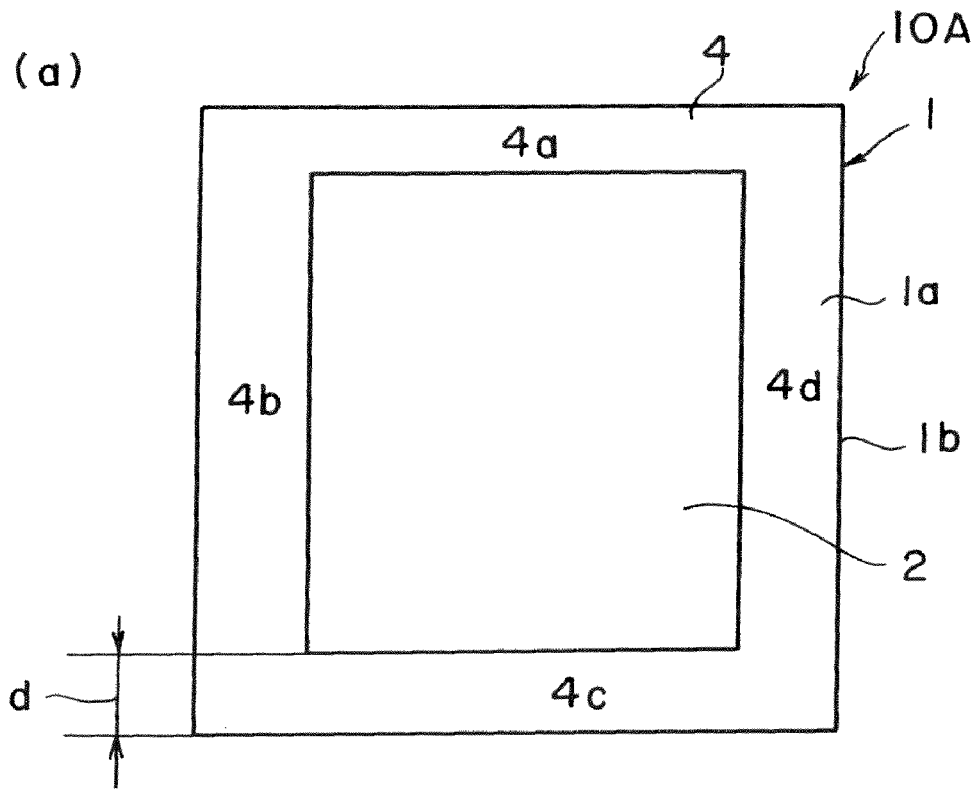
(b)
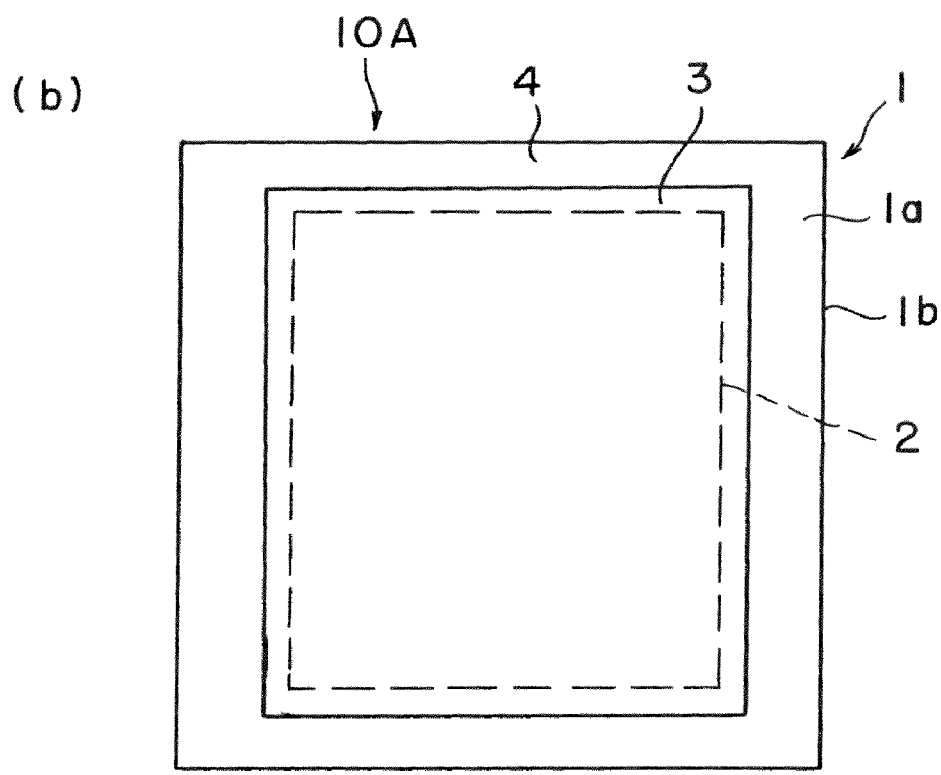

Fig. 2
(a)
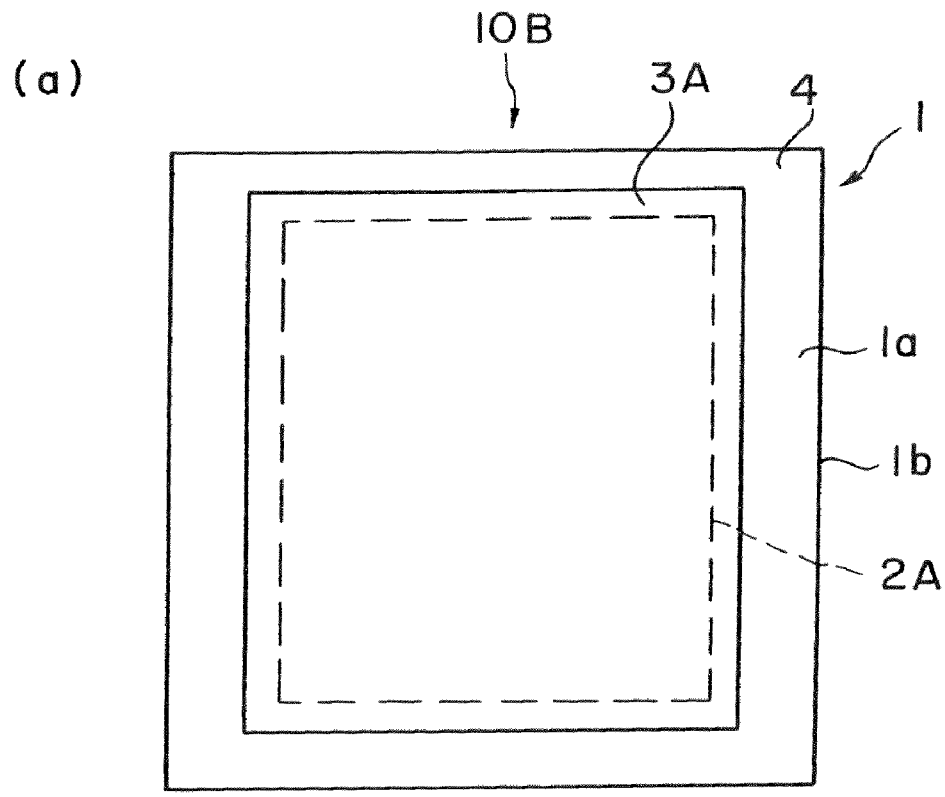
(b)
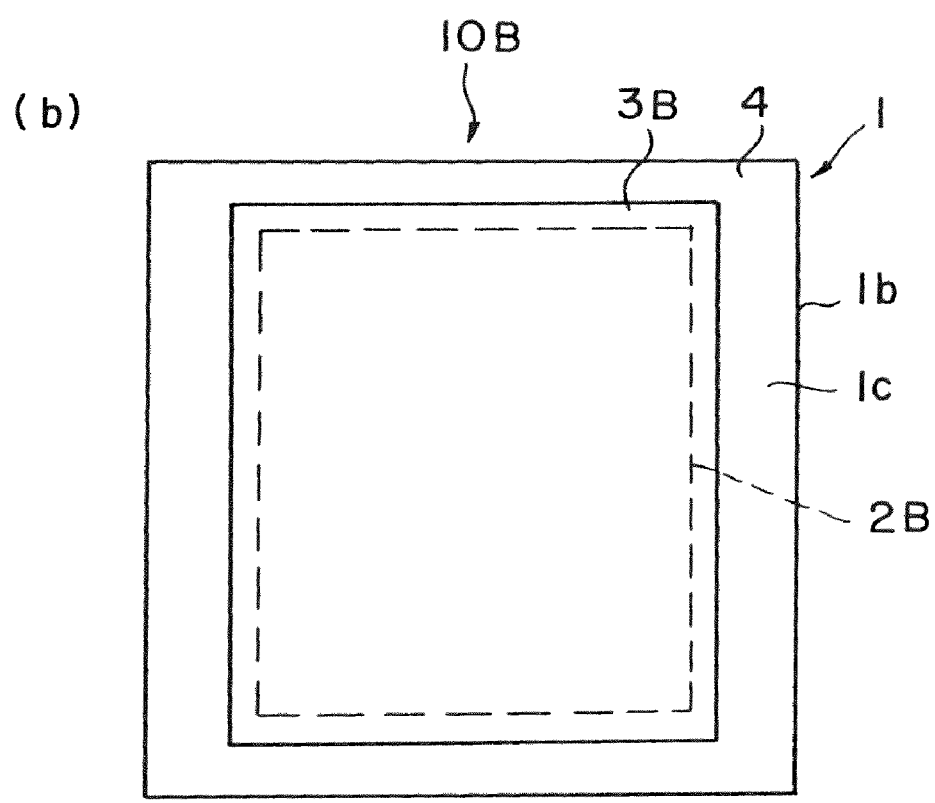

Fig. 3
(a)
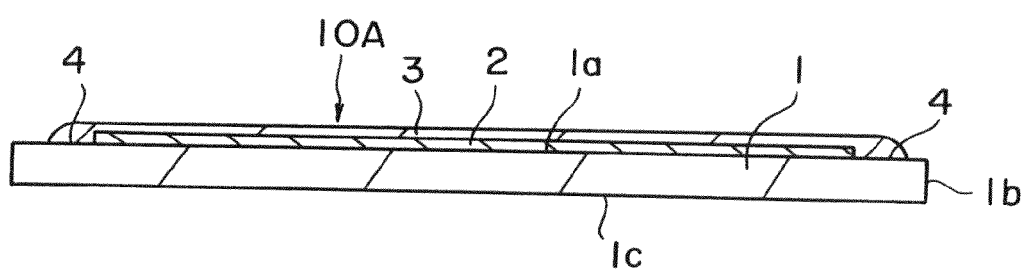
(b)
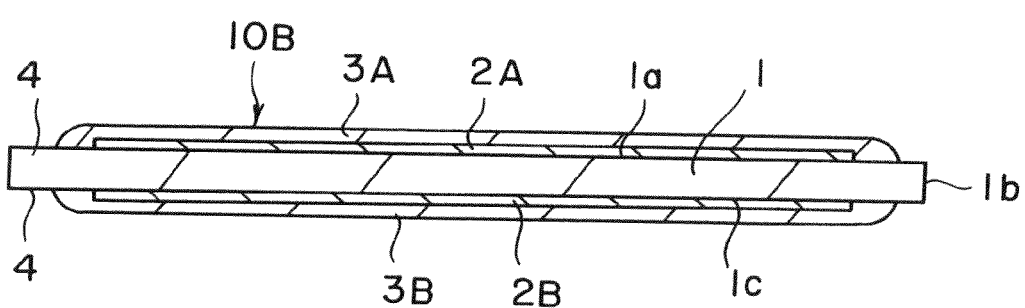

Fig. 4
(a)
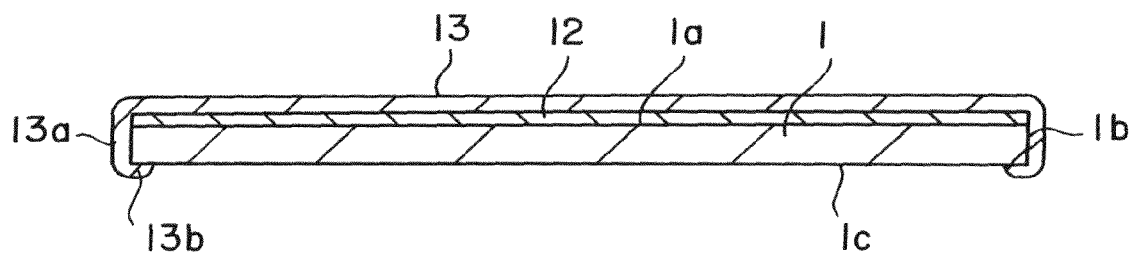
(b)
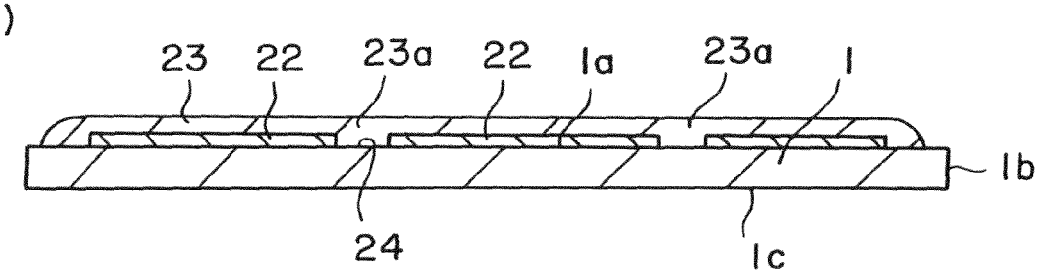

METHOD FOR MANUFACTURING III METAL NITRIDE SINGLE CRYSTAL

TECHNICAL FIELD OF THE INVENTION

The present invention relates to a method for growing a group III metal nitride single crystal.

BACKGROUND ARTS

Gallium nitride thin film crystal draws attention as excellent blue light-emitting devices, has been used as a material for light-emitting diodes and expected as a blue-violet semiconductor laser device for an optical pickup.

According to Japanese Patent Publication Nos. 2004-182551A and 2005-12171A, when an underlying film of a single crystal is formed on a substrate by flux method, the underlying film is divided to island shaped films and films of gallium nitride single crystal is then formed on the island-shaped underlying films.

DISCLOSURE OF THE INVENTION

When the GaN single crystal is grown by Na flux method, however, it is found that the GaN single crystal may be grown on the edge portion and even onto the back face, of a sapphire substrate, so that the edge part of the sapphire substrate is strongly bonded to the GaN single crystal (refer to FIGS. 2 and 13). As a result, a stress due to the difference of thermal expansion coefficients is applied between the grown GaN single crystal and regions other than the boundary of the sapphire substrate, so that the self-separation of the film may be prevented and cracks may be generated.

According to Japanese Patent Publication No. 2005-12171A, it is tried to obtain a nitride single crystal film of a large area by providing a plurality of the island-shaped underlying films on the substrate and growing the nitride single crystal on the island-shaped underlying films. It was then proved to be difficult to realize the self-separation of the single crystal film from the substrate. Then, the stress may remain in the single crystal film so that cracks may be finally generated.

Further, the applicant filed Japanese Patent application No. 2007-78893 (Patent Publication No. 2008-239365A) which was not published at the time of the priority application. In the application, it is disclosed that, when a single crystal underlying film is formed on a substrate by flux method, the underlying film is divided into island-shaped films and an elongate arm part is provided in each island-shaped underlying film.

In this case, however, at the tip end point of the arm part where the film starts to grow, the growth starting time at the merging regions where transformation concentrates tends to be retarded with respect to that in the other positions. As a result, the thickness of the grown gallium nitride single crystal tends to be fluctuated.

An object of the present invention is to grow a single crystal of a nitride of a metal of the group III using a template substrate by liquid phase process, to prevent the fluctuation of the thickness of the single crystal film, to prevent cracks in the single crystal film due to the difference of thermal expansion of a substrate main body and the nitride single crystal film, and to realize the self-separation of the film.

The present invention provides a method of growing a single crystal of a nitride of a metal belonging to the group III on an underlying film by a liquid phase process. The method uses a template substrate having a substrate main body having a side face and a pair of main faces and the underlying film of a single crystal of a nitride of a metal belonging to the group III formed at least on one main face of the substrate main body. The underlying film has a shape of a convex figure in a plan view. A surface without the underlying film formed thereon surrounds the entire circumference of the underlying film. The single crystal of a nitride of a metal belonging to the group III grown on the underlying film is not brought into contact with a single crystal of a nitride of a metal belonging to the group III formed on another underlying film.

According to the present invention, the underlying film has a shape of a convex figure in a plan view. It is thus possible to present the fluctuation of the thickness of the nitride single crystal, which is caused by the difference of the growth starting times at the merging positions where crystal transformation concentrates and at the underlying film.

Further, as the surface without the underlying film surrounds the entire circumference of the underlying film, it is possible to prevent the single crystal growing on the underlying film from reaching the outer edge of the substrate main body and thereby to prevent the covering of the side face and back face. It is thus possible to prevent the crack formation due to the covering of the side and back faces of the substrate main body with the nitride single crystal.

In addition to this, the single crystal of a nitride of a metal belonging to the group III grown on the underlying film is not brought into contact with a single crystal of a nitride of a metal belonging to the group III formed on another underlying film. That is, the single crystal of a nitride of a metal belonging to the group III on the underlying film is grown independently from the single crystal of a nitride of a metal belonging to the group III formed on another underlying film. It is thus possible to reduce the stress generated in the single crystal and to prevent the resulting cracks during the separation of the single crystal from the substrate main body.

BRIEF DESCRIPTION OF THE DRAWINGS

FIG. 1 (*a*) is a plan view showing a template substrate 10A according to an embodiment of the present invention, and FIG. 1 (*b*) is a plan view showing a nitride single crystal 3 formed on the template substrate 10A.

FIG. 2 (*a*) is a plan view showing a template substrate 10B viewed from a first main face 1*a*, and FIG. 2 (*b*) is a plan view showing the template substrate 10B viewed from a second main face 1*c*.

FIG. 3 (*a*) is a cross sectional view showing the template substrate 10A according to the present invention, and FIG. 3 (*b*) is a cross sectional view showing the template substrate 10B according to the present invention.

FIG. 4 (*a*) is a cross sectional view showing a template substrate and a single crystal 13 according to a comparative example, and FIG. 4 (*b*) is a cross sectional view showing a template substrate and a single crystal 23, according to a comparative example.

BEST MODES FOR CARRYING OUT THE INVENTION

Figure 5:
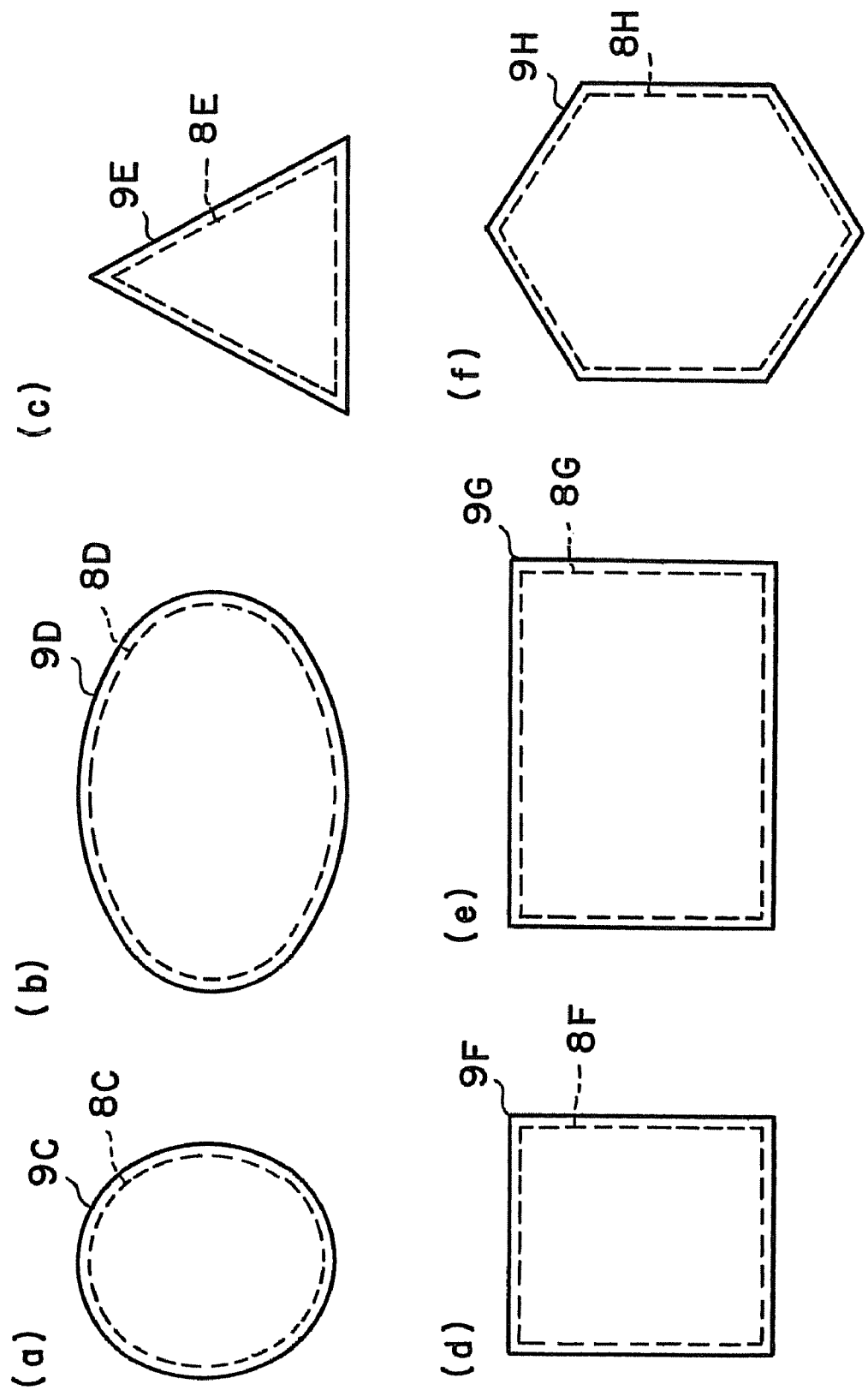
FIGS. 5 (*a*), (*b*), (*c*), (*d*), (*e*), and (*f*) are plan views showing underlying films and single crystals usable in the present invention, respectively.

The present invention will be described in detail below, with reference to the accompanying drawings.

FIG. 1 (a) is a plan view showing a template substrate 10A according to an embodiment of the present invention, and FIG. 1 (b) is a plan view showing a nitride single crystal 3 formed on the template substrate 10A.

A substrate main body 1 includes a pair of main faces and a side face 1b. The main body has a shape of a tetragon according to the present embodiment. An underlying film 2 made of a single crystal of a nitride of a metal belonging to the group III is formed on a first main face 1a of the substrate main body 1. An underlying film is not formed on a second main face of the main body 1. A surface 4 without an underlying film thereon is provided between the underlying film 2 and the outer edge of the main face 1a of the main body. That is, surfaces 4a, 4b, 4c and 4d without film are formed between four edges of the underlying film 2 and the outer edge of the main body, respectively.

As shown in FIGS. 1 (b) and 3 (a), a single crystal 3 is formed on the underlying film 2 by liquid phase process. During the process, the single crystal 3 tends to extend from the edge of the underlying film 2 toward the outside. According to the present example, however, the surface 4 without the film is provided between the edge of the underlying film 2 and the outer edge of the main face 1a. The single crystal 3 extends on the surface 4 without the film laterally, so that it is possible to prevent the single crystal from covering the side face 1b and further the opposite main face 1c.

FIG. 2 (a) is a plan view showing a template substrate 10B viewed from the side of the first main face 1a, and FIG. 2 (b) is a plan view showing the template substrate 10B viewed from the side of the second main face 1c.

The main body 1 has a shape of a tetragon according to the present embodiment. An underlying film 2A made of a single crystal of a nitride of a metal belonging to the group III is formed on the first main face 1a of the substrate main body 1. An underlying film 2B made of a single crystal of a nitride of a metal belonging to the group III is formed on the second main face 1c of the main body 1. Surfaces 4 without an underlying film thereon are provided between the underlying films 2A, 2B and the outer edges of the main faces 1a, 1c of the main body 1, respectively. That is, the surfaces 4 without the film are formed between four edges of the underlying films 2A, 2B and the outer edges of the main body, respectively.

As shown in FIGS. 2 (a), 2 (b) and 3 (b), single crystals 3A, 3B are grown on the underlying films 2A, 2B, respectively, by liquid phase process. The single crystals 3A and 3B extend on the surfaces 4 without the film laterally, so that it is possible to prevent the single crystal from covering the side face 1b and further the opposite main faces.

As shown in FIG. 4 (a), in the case that the underlying film 12 is formed to cover the entire surface of the main face 1a of the main body 1, it is found that the single crystal 13 extend as 13a and 13b toward the side face 1b and further the main face 1c on the opposite side. The single crystal 13 is thus strongly bonded to the side face 1b and the main face 1c of the main body. When a stress due to the difference of thermal expansion is applied between the main body and single crystal at this state, cracks tends to be generated in the single crystal 13.

Contrary to this, according to the present invention, the surface 4 without the underlying film is provided between the outer edge of the main body 1 and the underlying film to surround the entire circumference of the underlying film. It is thereby possible to prevent the single crystals 3, 3A and 3B from extending toward the side face 1b and the main face 1c on the opposite side.

Further, according to the present invention, the underlying films 2, 2A and 2B have a shape of a convex figure in a plan view. It means that any line connecting two points of the outline of the underlying film is positioned inside of the outline. Such figure includes circle, ellipse, race-track shape, or a polygon such as triangle, square, rectangle, hexagon, octagon or the like, for example as shown in FIG. 5.

In the case that the underlying film includes an arm or a concave part in a plan view, fluctuation in the thickness of the single crystal tends to occur near such part. According to the present invention, however, the underlying film is formed to have a shape of a convex figure without such arm or concave part. It is thus possible to prevent the fluctuation of the thickness of the single crystal.

In addition to this, according to the present invention, the single crystal of the nitride of a metal belonging to the group III is grown on the underlying film independently so that the single crystal is not brought into contact with a nitride single crystal of a metal belonging to the group III grown from another underlying film.

For example, the method described in Japanese Patent Publication No. 2005-12171A, a plurality of circular and island-shaped underlying films are provided on a substrate main body, so that single crystals are grown on the respective underlying films to form a larger bulk of the single crystal film. That is, as schematically shown in FIG. 4 (b), a plurality of circular underlying films 22 are provided on a main face 1a of the main body 1. A clearance 24 is formed between the underlying films 22. At this state, the single crystal is grown on the underlying films 22 to form a bulk 23 of the single crystal films. The single crystal films are connected to each other in the clearance 24 to form connecting parts 23a.

In the case of FIG. 4 (b), the adhesion of a part 23a of the single crystal 23 between the underlying films to the main body 1 should be weak. On the other hand, in the case of FIG. 3 (a), substantially whole of the single crystal film 23 contacts the underlying film 2. Therefore, in the case that the single crystals are independently grown as shown in FIG. 3 (a), the separation of the single crystal films was considered to be easier than the case of FIG. 4 (b).

However, the inventors have tried to perform the production and test, contrary to the expectation, cracks tend to occur near the connecting parts 23a due to the stress and the separation of the single crystal film from the main face is proved to be difficult, in the case of FIG. 4 (b). Contrary to this, in the case of the present invention, the stress is applied uniformly over the whole outer edge of the underlying film, so that the self-separation of the single crystal tends to occur and the cracks are prevented.

FIGS. 5 (a) to (f) are plan views showing planar patterns of underlying films and single crystals formed thereon, respectively.

According to an embodiment of FIG. 5 (a), an underlying film 8C has a shape of circle, and a single crystal film 9C is grown thereon. According to an embodiment of FIG. 5 (b), an underlying film 8D has a shape of ellipse or race track, and a single crystal film 9D is grown thereon. According to an embodiment of FIG. 5 (c), an underlying film 8E has a shape of triangle, and a single crystal film 9E is grown thereon. According to an embodiment of FIG. 5 (d), an underlying film 8F has a shape of tetragon, and a single crystal film 9F is grown thereon. According to an embodiment of FIG. 5 (e), an underlying film 8G has a shape of rectangle, and a single crystal film 9G is grown thereon. According to an embodiment of FIG. 5 (f), an underlying film 8H has a shape of hexagon, and a single crystal film 9H is grown thereon.

According to the present invention, preferably, the single underlying film is formed on the single substrate main body and the surface without film is provided between the underlying film and the edge of the substrate main body, for example as shown in FIGS. 1 to 3. However, a plurality of the underlying films may be formed on the single substrate main body. In this case, however, it is necessary that each of the single crystals grown on the respective underlying film are not brought into contact with each other. That is, it is necessary that the respective single crystals growing on the underlying films do not interfere with each other and that the crystals grow in the same manner as the case of growing such films on the underlying films formed independently on separate substrates.

Figure 6:
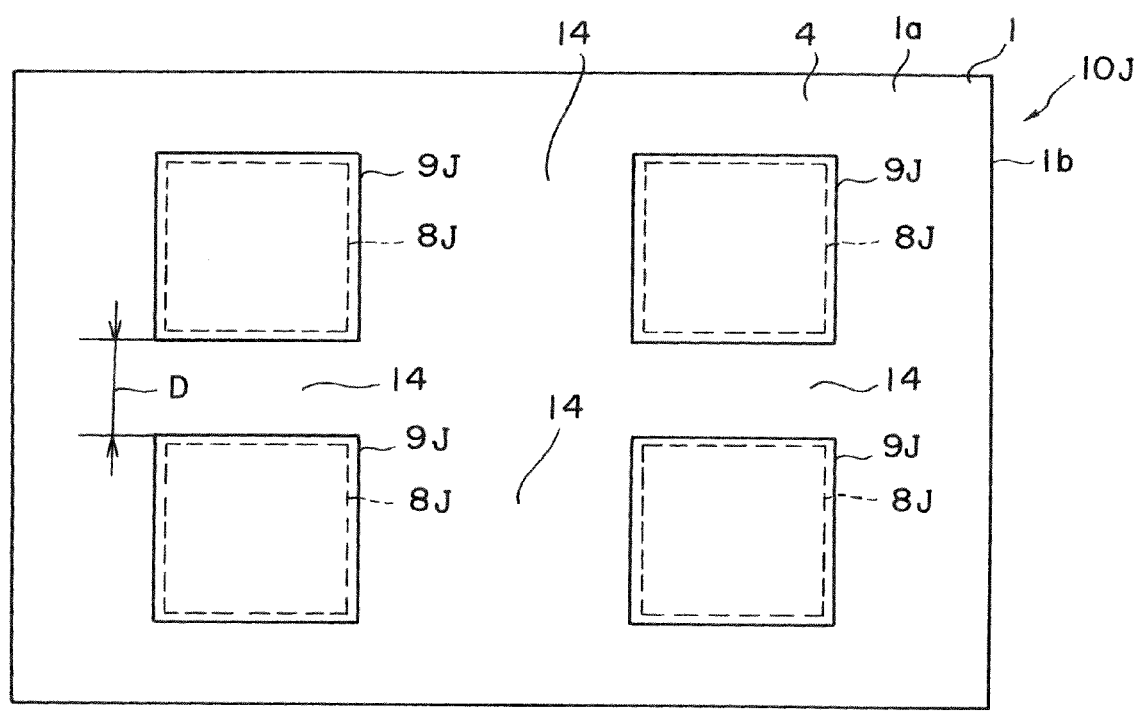
FIG. 6 is a plan view showing a template substrate 10J and a single crystal thereon according to an embodiment of the present invention.

For example, in a template substrate 10J of FIG. 6, a plurality of underlying films 8J are formed on the main face 1a of the main body 1. Single crystals 9J are formed on the respective underlying films, respectively. Surfaces 14 without the film is provided between the adjacent underlying films. It is necessary that the distance between the adjacent underlying films is large enough to prevent the contact of the single crystals grown on the respective underlying films The distance "d" of the underlying film and edge of the substrate main body (refer to FIG. 1 (a)) may preferably be 1 mm or larger and more preferably be 2 mm or larger, on the viewpoint of preventing the extension of the single crystal to the side face. Although the upper limit of "d" is not particularly defined, the production of the single crystal tends to be reduced when "d" is too large. On the viewpoint of the production, "d" may preferably be 10 mm or smaller.

For example as shown in FIG. 6, in the case that a plurality of the underlying films are provided on the main body, the distance (minimum value) "D" of the adjacent underlying films may preferably be 2 mm or larger and more preferably be 4 mm or larger, on the viewpoint of preventing the extension of the single crystal to the side face of the main body. Although the upper limit of "D" is not particularly defined, the production of the single crystal tends to be reduced when "D" is too large. On the viewpoint of the production, "D" may preferably be 10 mm or smaller.

Provided that 100 percent is assigned to the area of the main face 1a of the main body with the underlying film formed, the area of the surface without the film of the main body may preferably be 10 to 90 percent and more preferably be 30 to 50 percent.

Although the underlying film may be positioned in a central part of the main body, the underlying film may preferably be positioned offset toward the upper part of the main body. In the case that the template substrate is positioned vertically in a crucible to grow GaN single crystal, the thickness of the GaN single crystal tends be larger as it is nearer to the bottom of the crucible to progress the growth and the extension. The area of the seed crystal is maintained, the area of the surface without the film in made larger in the lower part of the substrate and the seed crystal region is shifted to the upper part of the sapphire substrate, so that it is possible to prevent the extension and to assure the epitaxial growth area effectively.

A method of providing the underlying film and surface without the film on the main body is not particularly limited, and the followings are listed.

(1) The edge part of the main body is masked to form the underlying film.

(2) An underlying film is formed on the whole of the main body and the underlying film is then removed by etching or grinding.

The material of the substrate main body is not particularly limited, and examples of such a material include sapphire, silicon single crystal, SiC single crystal, MgO single crystal, spinel ($MgAl_2O_4$), $LiAlO_2$, $LiGaO_2$, and perovskite composite oxides such as $LaAlO_3$, $LaGaO_3$ and $NdGaO_3$. Also, it is possible to use cubic perovskite structure composite oxides represented by the composition formula $[A_{1-y}(Sr_{1-x}Ba_x)_y][(Al_{1-z}Ga_z)_{1-u} \cdot D_u]O_3$ (where A is a rare-earth element, D is one or more elements selected from the group consisting of niobium and tantalum, y=0.3 to 0.98, x=0 to 1, z=0 to 1, u=0.15 to 0.49, and x+z=0.1 to 2). In addition, SCAM ($ScAlMgO_4$) may be also used.

The single crystal of the nitride of a metal belonging to the group III forming the underlying film is a nitride of one or more metal selected from the group consisting of Ga, Al and In, and includes GaN, AlN, GaAlN, GaAlInN and the like. It may preferably be GaN, AlN or GaAlN and most preferably be AlN.

The thickness of the underlying film is not particularly limited. On the viewpoint of preventing melt back of the underlying film into flux, the thickness may preferably be 1 μm or more. Further, as the thickness of the underlying film is large, it takes a long time to form the underlying film. On the viewpoint, the thickness of the underlying film may be 50 μm or less.

The present invention is applicable to liquid phase process. Such liquid phase process includes flux method, high temperature solution method and ammonothermal method.

According to the present invention, as long as the group III metal nitride single crystal can be generated, a type of the flux is not particularly limited. In a preferred embodiment, the flux containing at least one of an alkaline metal and an alkaline-earth metal is used, and the flux containing sodium metal may be particularly preferably used.

As to the flux, raw materials of the group III metal nitride single crystal to be desired are mixed and used. The single crystal of the nitride of a metal belonging to the group III is the nitride of one or more metal selected from the group consisting of Ga, Al, In and B, and includes GaN, AlN, GaAlN, GaAlInN, BN and the like.

The raw materials composing the flux are selected in accordance with the group III metal nitride single crystal to be desired.

As such gallium raw materials, for example, gallium single metal, a gallium alloy or a gallium compound may be used; in terms of handling, gallium single metal may be used preferably. As such aluminum raw materials, aluminum single metal, an aluminum alloy or an aluminum compound may be used; in terms of handling, aluminum single metal may be used preferably. As such indium raw materials, indium single metal, an indium alloy or an indium compound may be used; in terms of handling, indium single metal may be used preferably.

The growth temperature of the group III nitride single crystal in the flux method and the holding time during the growth are not particularly limited in the present invention, and they are appropriately changed in accordance with a type of the single crystal to be desired or a composition of the flux. As an example, when GaN single crystal is grown using a flux containing sodium or lithium, the growth temperature may be set to 800° C. to 1000° C.

According to a preferred embodiment, the single crystal of the nitride of a metal belonging to the group III is grown in atmosphere of mixed gases containing nitrogen gas. Although the total pressure of the atmosphere is not particularly limited, it may be preferably set to 10 atms or more, and further preferably 30 atm or more, on the viewpoint of prevention against the evaporation of the flux. However, as the pressure is high, an apparatus becomes large. Therefore, the total pressure of the atmosphere may be preferably set to 2000 atms or less, and further preferably 1000 atms or less.

Further, although the nitrogen partial pressure in the atmosphere is not particularly limited, it may preferably be 10 to 2000 atms and more preferably be 100 to 1000 atms in the case that gallium nitride is grown. In the case that aluminum nitride is grown, it may preferably be 0.1 to 50 atms and more preferably be 1 to 10 atms.

Any other gas except the nitrogen-containing gas in the atmosphere is not limited; but an inert gas may be preferably used, and argon, helium, or neon may be particularly preferably used. The partial pressure of such gas other than nitrogen is a value obtained by subtracting the nitrogen partial pressure from the total pressure.

Actual growing method is not particularly limited in the present invention. For example, the template substrate may be immersed in flux in a crucible contained in a pressure vessel and heated while nitrogen-containing atmosphere is supplied into the pressure vessel. Further, the template substrate may be fixed at a predetermined position and the crucible containing flux may be moved upwardly, so that the surface of the underlying film is brought into contact with the flux.

It is proved that the present invention is effective in preventing cracks of grown single crystal, when it is used a template substrate having non-polar seed crystal films such m-face GaN, a-face GaN or semi-polar seed crystal films such as r-face GaN.

EXAMPLES

Inventive Example 1

The gallium nitride film was formed on the template substrate 10A according to the process described referring to FIGS. 1 and 3 (a). Specifically, the substrate main body 1 had a planer shape of rectangle with dimensions of 13×18 mm. The underlying film of GaN with a thickness of 30 μm was formed over the whole surface of the main face 1a of the main body with HVPE process. The underlying film was polished to leave the underlying film 2 having a length of 9 mm and a width of 13 mm. "d" was 2 mm.

3 g of gallium metal (Ga) as the raw material, 4 g of sodium metal (Na) as the flux and the template substrate were weighed and contained in a growing container. The growing process was carried out for 200 hours at growing condition of a nitrogen pressure of 4 MPa and a temperature of 875° C.

Figure 7:
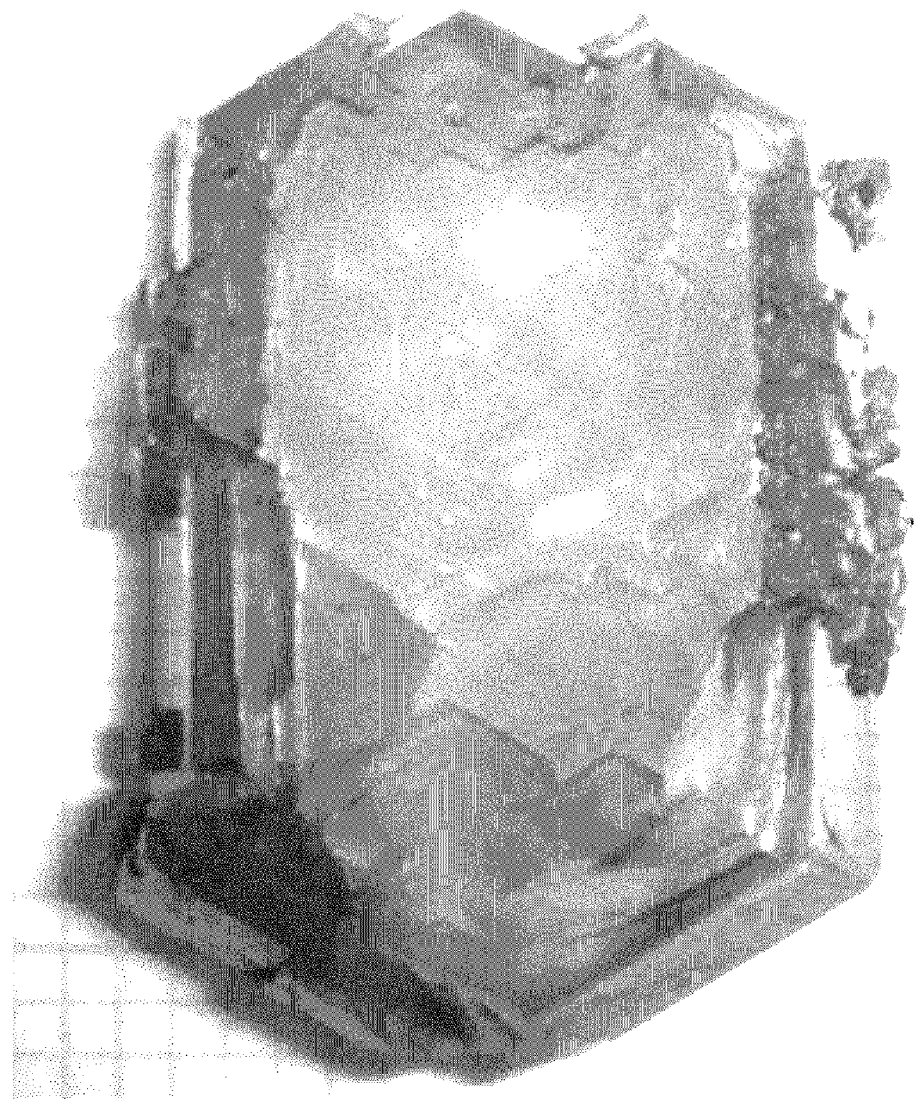
FIG. 7 shows a photograph of appearance of GaN single crystal after the growth according to Inventive Example 1.
Figure 8:
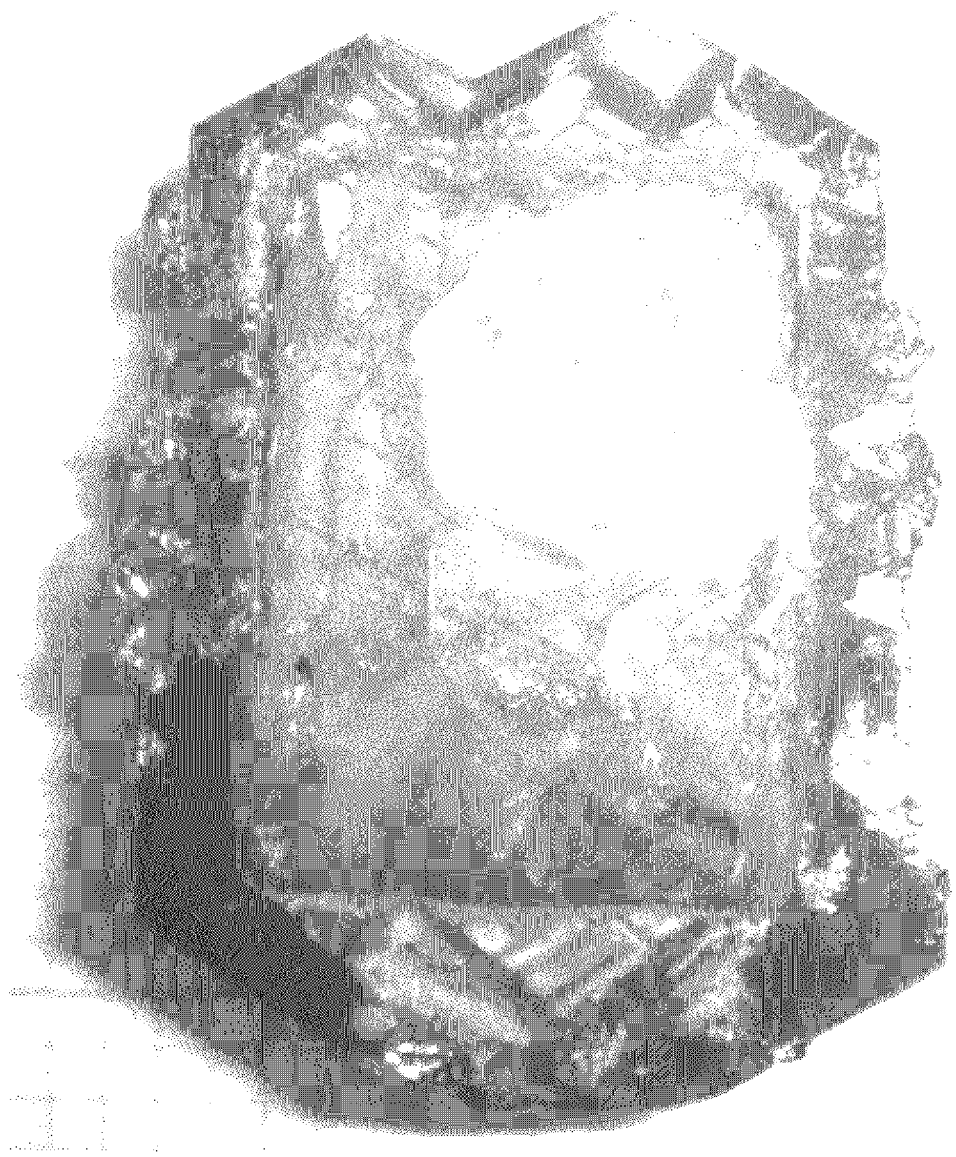
FIG. 8 is a photograph showing appearance of the GaN single crystal of FIG. 7 after the separation from a substrate main body.

FIG. 7 is a photograph showing appearance of GaN single crystal after the growth. Further, FIG. 8 is a photograph showing appearance of the GaN single crystal after it is separated from the substrate main body (back face of the GaN single crystal). The GaN single crystal is grown on the back face of the sapphire substrate main body at one region of the edge, and cracks were observed near the region. However, in regions covering about 80 percent where the extension of the GaN single crystal was not observed, the sapphire on the back face was self-separated after the growth. Further, after the extended GaN single crystal was removed, the remaining sapphire was self-separated.

Inventive Example 2

Gallium nitride film was formed on the respective main faces of the template substrate 10B, according to the process described referring to FIGS. 2 and 3 (b). Specifically, the main body 1 had a planar shape of rectangle with dimensions of 13×18 mm. The underlying films of GaN with a thickness of 5 μm were formed on the whole surfaces of the main faces 1a and 1c, respectively, of the main body with MOCVD process. The underlying film was polished to leave the underlying film 2 having a length of 9 mm and a width of 13 mm. "d" was 2 mm.

3 g of gallium metal (Ga) as the raw material, 4 g of sodium metal (Na) as the flux and the template substrate were weighed and contained in a growing container. The growing process was carried out for 200 hours at growing condition of a nitrogen pressure of 4 MPa and a temperature of 875° C.

Figure 9:
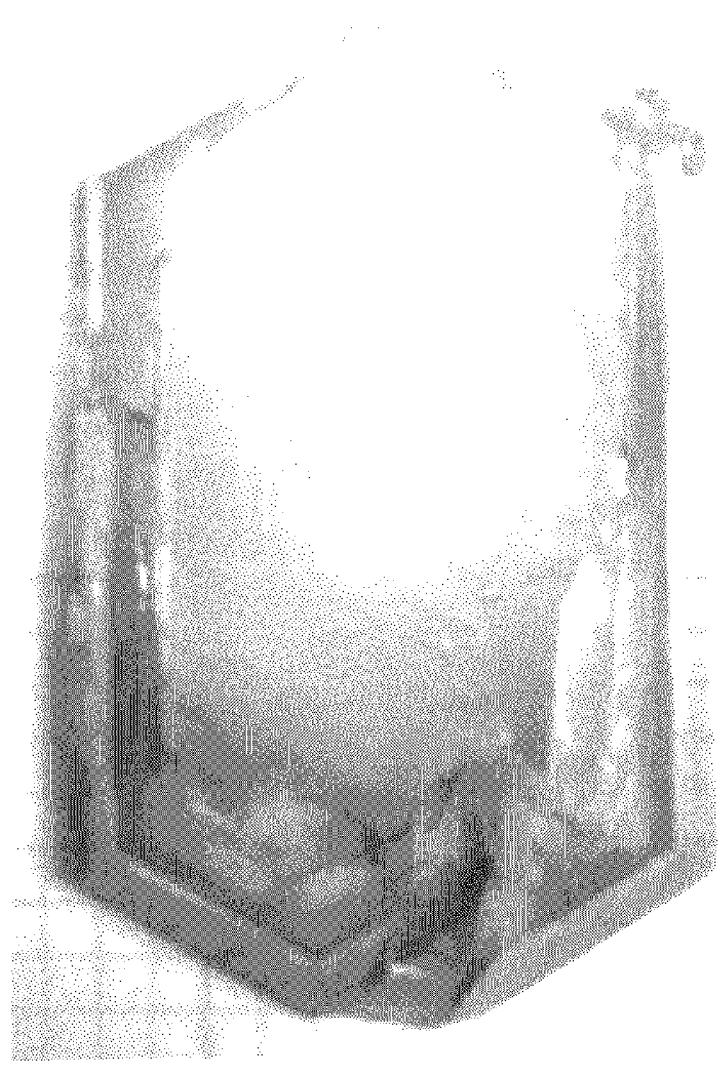
FIG. 9 shows a photograph of appearance of GaN single crystal after the growth according to Inventive Example 2.
Figure 10:
FIG. 10 is a photograph showing appearance of the GaN single crystal of FIG. 9 after the separation from a substrate main body.

FIG. 9 is a photograph showing appearance of GaN single crystal after the growth. Further, FIG. 10 is a photograph showing appearance of the GaN single crystal after it is separated from the main face of the substrate (back face of the GaN single crystal). The GaN single crystals grown on the surface and back face of the template substrate were not connected with each other at the edge. After the growth, the GaN crystals on the both faces were self-separated from the sapphire. Cracks were not found on one of the GaN single crystals and only one crack was observed in the other of the GaN single crystals.

Inventive Example 3

Gallium nitride film was formed on the template substrate 10A, according to the process described referring to FIGS. 1 and 3 (a). Specifically, the edge part of the substrate main body of sapphire of 2-inch size was masked with $SiO_2$ film. The underlying film 2 of GaN single crystal was formed in a region with a length of 1.5 inch and a width of 1.5 inch except the marked region. "d" was 6.3 mm.

30 g of gallium metal (Ga) as the raw material, 40 g of sodium metal (Na) as the flux and the template substrate were weighed and contained in a growing container. The growing process was carried out for 200 hours at growing condition of a nitrogen pressure of 4 MPa and a temperature of 875° C.

After the growth, the GaN single crystal was self-separated from the sapphire and cracks were not observed. As a clearance was observed between the edge of the GaN seed crystal and the edge of the sapphire, it was proved that the grown GaN single crystal did not extend to the back face of the sapphire and the ease of the self-separation of the GaN single crystal from the sapphire was improved. It was further considered that the cracks were prevented as the self-separation could be made easier.

Comparative Example 1

GaN single crystal was grown according to the process described referring to FIG. 4 (a). Specifically, the underlying film 12 made of GaN and with a thickness of 30 μm was formed on the main face 1*a* of the main body 1 of sapphire with dimensions of 13×18 mm. The underlying film 12 covered the whole surface of the main face 1*a*. GaN single crystal was grown on the template substrate according to the same weighing method and growing condition as the Inventive Example 1.

Figure 11:
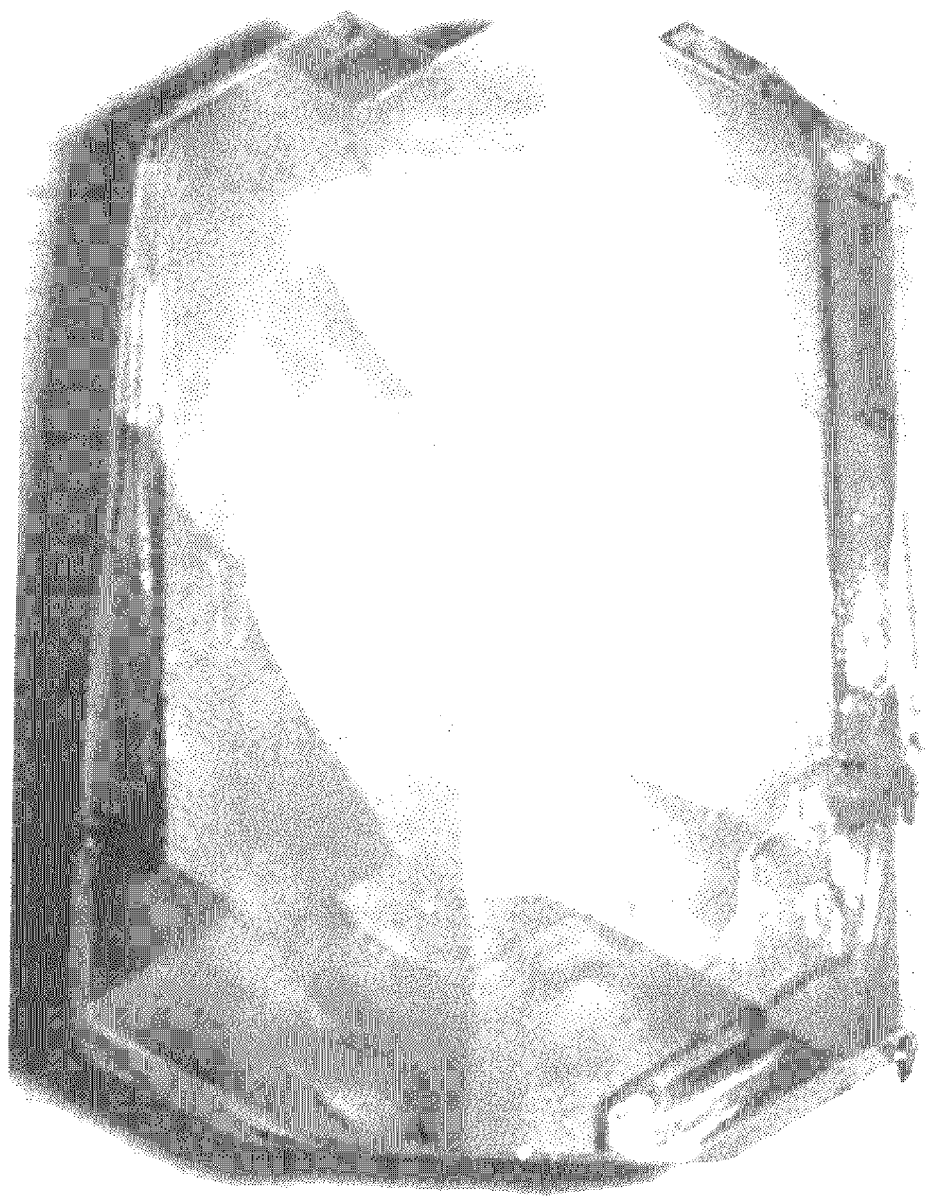
FIG. 11 shows a photograph of appearance of a surface of GaN single crystal after the growth according to Comparative Example 1.
Figure 12:
FIG. 12 is a photograph showing appearance of the back face of a template substrate with the GaN single crystal of FIG. 11 formed thereon.
Figure 13:
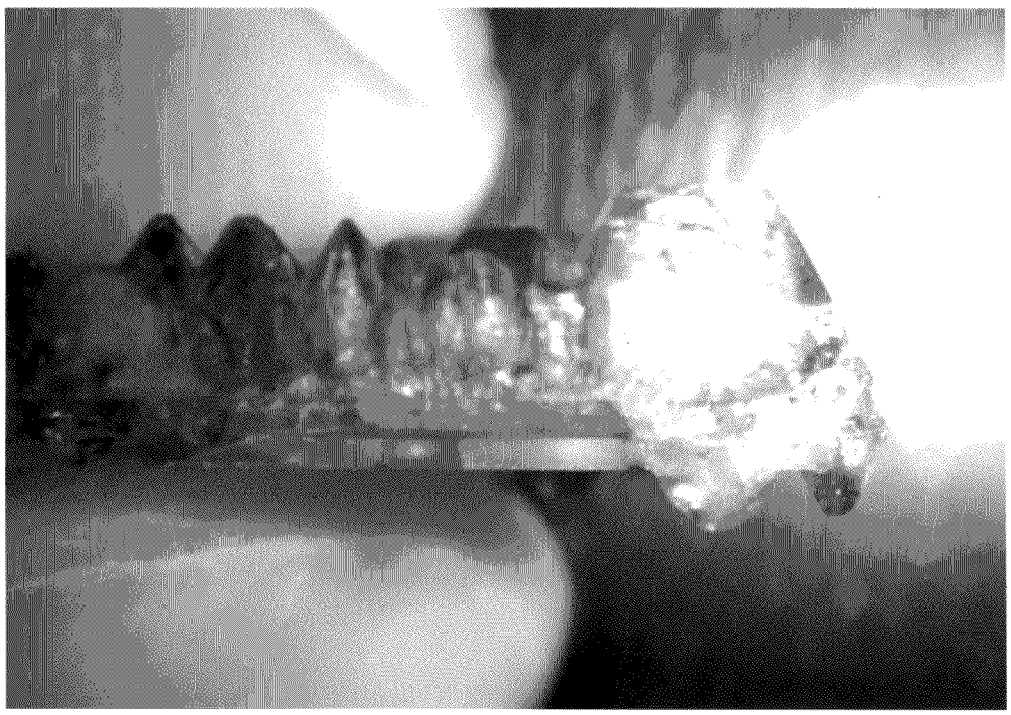
FIG. 13 is a photograph showing appearance of the GaN single crystal and template substrate of FIG. 11 viewed in a horizontal direction.

FIG. 11 is a photograph showing appearance of the surface of the GaN single crystal after the growth. Further, FIG. 12 is a photograph showing appearance of the back side of the template substrate with the GaN single crystal formed. Further, FIG. 13 is a photograph showing appearance of the GaN and template substrate viewed laterally. The single crystal extended to and grows on the back face of the sapphire and could not be separated. Further, many cracks were observed on the surface of the GaN single crystal.

Comparative Example 2

The substrate main body 1 of sapphire with dimensions of 10 mm×10 mm was prepared. Elongate stripes of the underlying films of a seed crystal with a thickness of 10 μm was patterned on the main face 1*a* of the main body 1. The period of the underlying film was 9 μm, the width of each underlying film was 3 μm and the distance of the adjacent underlying films was 6 μm. GaN single crystal was grown according to the same weighing method and growing condition as the Inventive Example 1. After the growth, the GaN single crystal was not separated from the sapphire and cracks were observed.

Comparative Example 3

GaN single crystal was grown according to the method described referring to FIG. 4 (*b*). Specifically, the substrate main body 1 of sapphire with a length of 10 mm and a width of 10 mm was prepared. Many circular underlying films 22 of GaN seed crystal with a diameter of 3 μm and a thickness of 10 μm were formed on the main face 1*a* of the main body. The distance "D" of the adjacent underlying films 22 was 6 μm.

GaN single crystal was grown according to the same weighing method and growing condition as the Inventive Example 1. After the growth, the GaN single crystal was integrated as a single film. The GaN single crystal was not separated from the sapphire and cracks were observed.

Although the present invention has been described with reference to particular embodiments, the invention is not limited thereto and various changes and modification may be made without departing from the scope of the appended claims.

The invention claimed is:

1. A method of growing a single crystal of a nitride of a metal belonging to the group III, the method using a template substrate comprising a substrate main body having a side face and a pair of main faces and an underlying film of a single crystal of a nitride of a metal belonging to the group III formed at least on one main face of the substrate main body to grow said single crystal on said underlying film by a liquid phase process, wherein said underlying film has a shape of a convex figure in a plan view, wherein a surface without the underlying film thereon surrounds the entire circumference of said underlying film, and wherein said single crystal of a nitride of a metal belonging to the group III grown on said underlying film is not brought into contact with a single crystal of a nitride of a metal belonging to the group III formed on another underlying film.

2. The method of claim 1, wherein said single underlying film is formed on said single substrate main body, and wherein said surface without the film thereon is provided between said underlying film and an edge of said substrate main body.

* * * * *